US012806737B2

(12) United States Patent
Cho et al.

(10) Patent No.: US 12,806,737 B2
(45) Date of Patent: Nov. 24, 2026

(54) MANUFACTURING METHOD OF DISPLAY DEVICE

(71) Applicant: Samsung Display Co., Ltd., Yongin-si (KR)

(72) Inventors: Hyunjun Cho, Seoul (KR); Seongjun Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 894 days.

(21) Appl. No.: 17/994,791

(22) Filed: Nov. 28, 2022

(65) Prior Publication Data

US 2023/0278167 A1 Sep. 7, 2023

(30) Foreign Application Priority Data

Mar. 4, 2022 (KR) ........................ 10-2022-0028398

(51) Int. Cl.
*B24C 1/04* (2006.01)
*H05K 5/00* (2025.01)

(52) U.S. Cl.
CPC ............. *B24C 1/04* (2013.01); *H05K 5/0018* (2022.08)

(58) Field of Classification Search
CPC ........ B24C 1/04; B24C 1/045; H05K 5/0018; G09F 9/301
USPC ................................................ 451/29–31, 38
See application file for complete search history.

(56) References Cited

U.S. PATENT DOCUMENTS 4,430,416 A * 2/1984 Goto ......................... G03F 7/12 430/323
5,989,689 A * 11/1999 Komatsu .................. C09J 11/08 428/355 R
6,276,992 B1 * 8/2001 Houda ................. H05K 3/0044 451/29
6,464,905 B1 * 10/2002 Lu ........................ G02B 5/0278 264/2.7
9,536,931 B2 1/2017 Kim et al.
(Continued)

FOREIGN PATENT DOCUMENTS

KR 20120057476 A 6/2012
KR 20130085195 A 7/2013
(Continued)

OTHER PUBLICATIONS

Hwang, KR-102369002-B1 machine translation, Mar. 3, 2022 (Year: 2022).*

(Continued)

*Primary Examiner* — Brian D Keller
*Assistant Examiner* — Marcel T Dion
(74) *Attorney, Agent, or Firm* — CANTOR COLBURN LLP

(57) ABSTRACT

A method for manufacturing a display device which is divided into a folding region and a non-folding region and includes a support member in which a plurality of openings is defined corresponding to the folding region, and a display module disposed in an upper portion of the support member includes providing a preliminary support member including carbon reinforced fiber or glass reinforced fiber, providing a mask in which a plurality of mask openings is defined on the preliminary support member, spraying an abrasive on the preliminary support member exposed by the plurality of mask openings, and removing the mask.

11 Claims, 13 Drawing Sheets

(56) References Cited

U.S. PATENT DOCUMENTS

| | | | | |
|---|---|---|---|---|
| 10,074,824 | B2 | 9/2018 | Han et al. | |
| 10,791,206 | B2 | 9/2020 | Lee | |
| 11,481,002 | B2 | 10/2022 | Park | |
| 11,681,330 | B2 * | 6/2023 | Sim | G06F 3/0412 345/173 |
| 12,013,729 | B2 * | 6/2024 | Yang | G06F 1/1616 |
| 12,130,669 | B2 * | 10/2024 | Wang | G02F 1/133 |
| 2004/0017152 | A1 * | 1/2004 | Hashimoto | H10K 59/877 313/506 |
| 2007/0160810 | A1 * | 7/2007 | Hayashi | C23C 18/1651 428/156 |
| 2010/0285725 | A1 * | 11/2010 | Wee | H05K 3/04 451/38 |
| 2021/0008689 | A1 * | 1/2021 | Moser | C23C 4/02 |
| 2021/0282285 | A1 * | 9/2021 | Sunwoo | B32B 1/00 |
| 2022/0397969 | A1 * | 12/2022 | Sim | G06F 1/1652 |
| 2023/0071578 | A1 * | 3/2023 | Sim | B32B 15/09 |

FOREIGN PATENT DOCUMENTS

| | | | | |
|---|---|---|---|---|
| KR | 20170051625 | A | 5/2017 | |
| KR | 1020180036904 | A | 4/2018 | |
| KR | 20220019898 | A | 2/2022 | |
| KR | 102369002 | B1 * | 3/2022 | H01L 51/5237 |
| WO | WO-2007091476 | A1 * | 8/2007 | B24C 11/005 |

OTHER PUBLICATIONS

Hiroaki, WO-2007091476-A1 machine translation, Aug. 16, 2007 (Year: 2007).*

* cited by examiner

MANUFACTURING METHOD OF DISPLAY DEVICE

This application claims priority to Korean Patent Application No. 10-2022-0028398, filed on Mar. 4, 2022, and all the benefits accruing therefrom under 35 U.S.C. § 119, the content of which in its entirety is herein incorporated by reference.

BACKGROUND

1. Field

The disclosure herein relates to a method for manufacturing a display device, and more specifically, to a method for manufacturing a display device by a mask.

2. Description of the Related Art

Various display devices used for multimedia devices such as a television, a mobile phone, a tablet computer, a navigation system, and a game machine are being developed. Recently, in order to facilitate portability and improve user convenience, display devices which are foldable or rollable by being provided with bendable flexible display members are being developed.

In order to protect a display module included in the display device, a support module disposed on a lower portion of the display module is applied. The support module is desired to have both high-strength properties for protecting the display module, and flexibility for implementing a flexible display device. There is a demand for the development of a material of a support module, and a structure of a support module, which may satisfy both the high-strength properties and the flexibility.

SUMMARY

The disclosure provides a method for manufacturing a display device including a simplified process by including an operation in which a mask is directly disposed on a preliminary support member, and then an abrasive is sprayed on the mask.

An embodiment of the inventive concept provides a method for manufacturing a display device which is divided into a folding region and a non-folding region, and includes a support member in which a plurality of openings is defined corresponding to the folding region, and a display module disposed in an upper portion of the support member. The method includes providing a preliminary support member including carbon reinforced fiber or glass reinforced fiber, providing a mask in which a plurality of mask openings is defined on the preliminary support member, spraying an abrasive on the preliminary support member exposed by the plurality of mask openings, and removing the mask.

In an embodiment, a strength of the abrasive may be less than a strength of the mask, and greater than a strength of the preliminary support member.

In an embodiment, the abrasive may include an aluminum oxide.

In an embodiment, the providing the mask on the preliminary support member may include providing a preliminary mask on the preliminary support member, and defining the plurality of mask openings on the preliminary mask.

In an embodiment, the defining the plurality of mask openings on the preliminary mask may include wet-etching the preliminary mask.

In an embodiment, the providing the mask on the preliminary support member may further include, between the providing the preliminary mask on the preliminary support member and the defining the plurality of mask openings on the preliminary mask, providing a support substrate including a same material as that of the preliminary mask on a lower surface facing an upper surface of the preliminary support member.

In an embodiment, the providing the mask on the preliminary support member may include defining the plurality of mask openings on a preliminary mask and then providing the mask on the preliminary support member.

In an embodiment, in the providing the mask on the preliminary support member, the mask may be directly disposed on the preliminary support member.

In an embodiment, the method may further include, between the providing the preliminary support member and the providing the mask on the preliminary support member, providing a sacrificial layer on the preliminary support member, wherein the mask may be disposed on the sacrificial layer.

In an embodiment, the spraying the abrasive on the preliminary support member may include defining sacrificial openings on the sacrificial layer exposed by the plurality of mask openings, and defining openings in the preliminary support member exposed by the plurality of mask openings and the sacrificial openings.

In an embodiment, a strength of the sacrificial layer may be less than a strength of the abrasive.

In an embodiment, the sacrificial layer may include a polyurethane-based resin, or a silicone-based resin.

In an embodiment, the mask may include at least one of an SUS alloy, an Invar alloy, aluminum, copper, or thermoplastic polyurethane.

In an embodiment, the abrasive may have an average diameter of about 30 micrometers (μm) to about 100 μm.

In an embodiment, the mask may have a thickness of about 30 μm to about 100 μm.

In an embodiment, the preliminary support member may have a thickness of about 120 μm to about 200 μm.

In an embodiment, a width of each of the plurality of mask openings in a first direction may be greater than a diameter of the abrasive.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
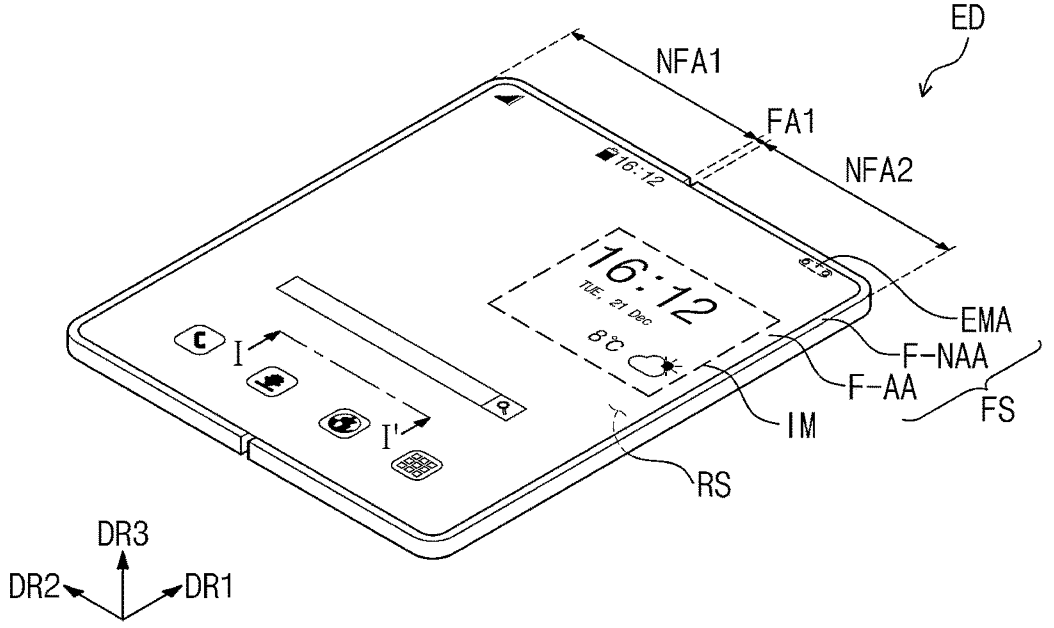
FIG. 1A is a perspective view showing an embodiment of a display device in an unfolded state according to the inventive concept.

In the disclosure, when an element (or a region, a layer, a portion, or the like) is also referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated components may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, a method for manufacturing a display device in an embodiment of the inventive concept will be described with reference to the accompanying drawings.

FIG. 1A is a perspective view showing an embodiment of a display device in an unfolded state according to the inventive concept. FIG. 2B is a perspective view showing an in-folding process of the display device illustrated in FIG. 1A. FIG. 1C is a perspective view showing an out-folding process of the display device illustrated in FIG. 1A.

Figure 1B:
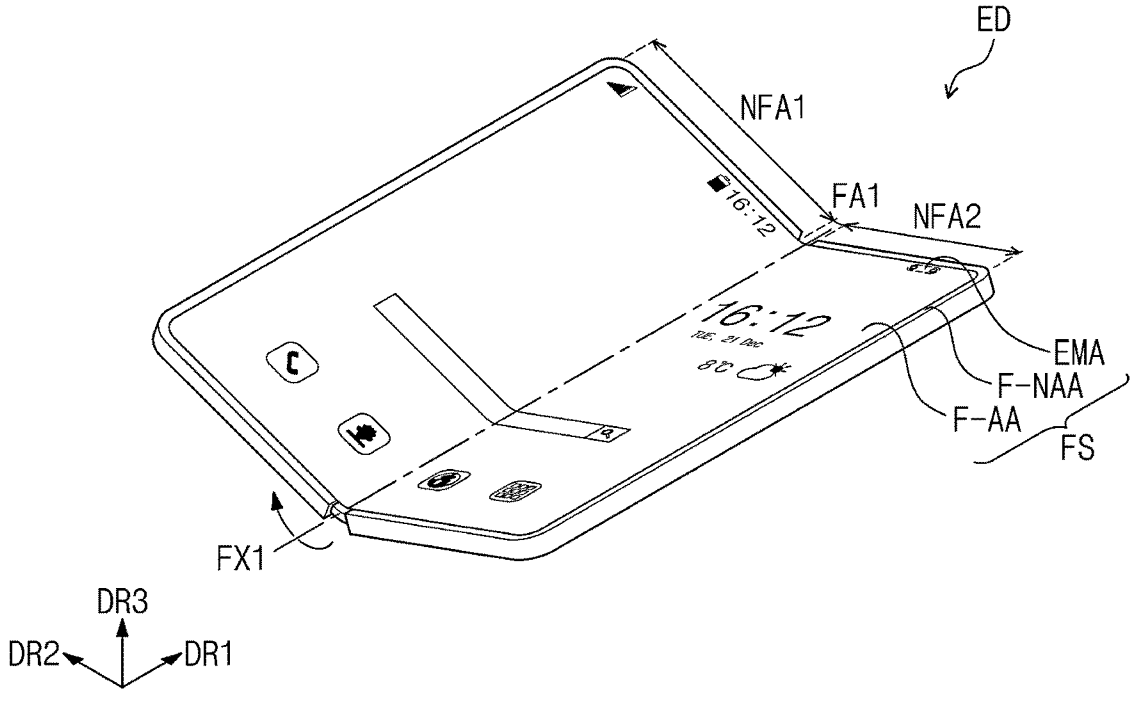
FIG. 1B is a perspective view showing an in-folding process of the display device illustrated in FIG. 1A.
Figure 1C:
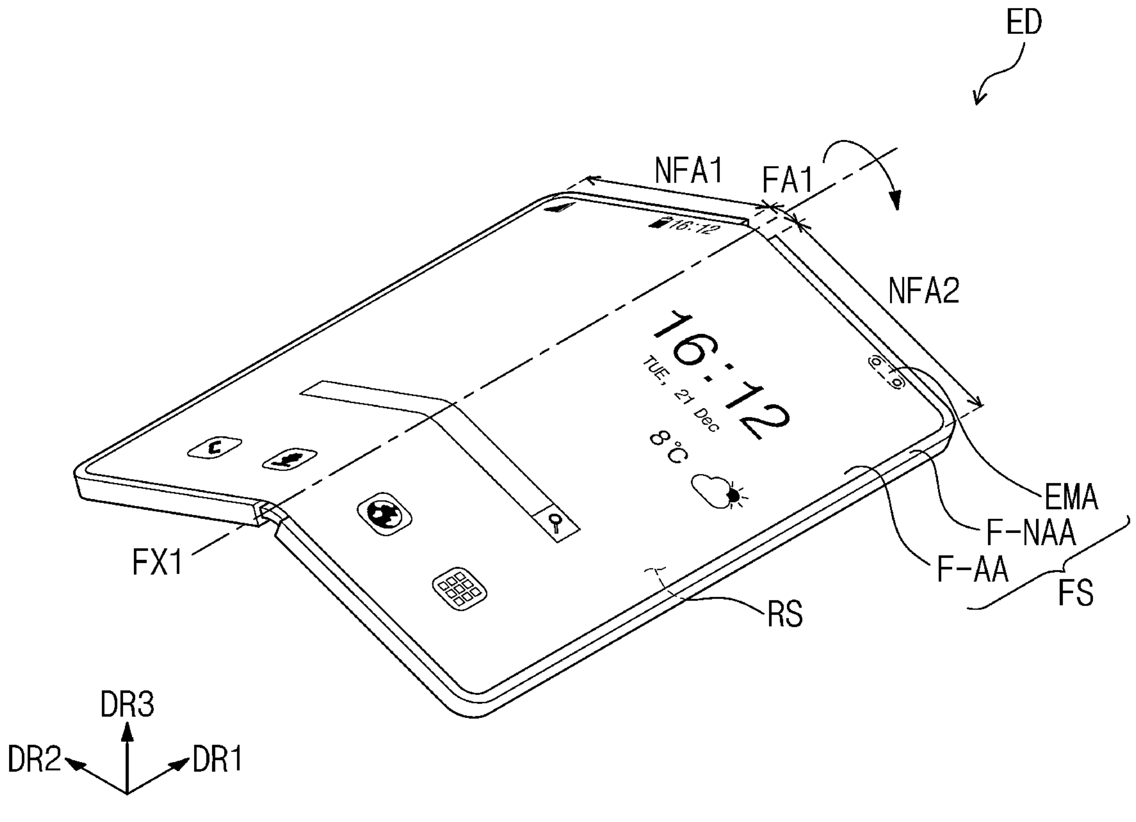
FIG. 1C is a perspective view showing an out-folding process of the display device illustrated in FIG. 1A.

Referring to FIG. 1A to FIG. 1C, a display device ED of an embodiment may be a device activated according to an electrical signal. In an embodiment, the display device ED may be a mobile phone, a tablet computer, a car navigation system, a game console, or a wearable device, for example, but the invention is not limited thereto. In FIG. 1A or the like of the disclosure, the display device ED is illustrated as a mobile phone.

The display device ED in an embodiment may include a first display surface FS defined by a first direction axis DR1 and a second direction axis DR2 crossing the first direction axis DR1. The display device ED may provide an image IM to a user through the first display surface FS. The display device ED of an embodiment may display the image IM toward the third direction axis DR3 on the first display surface FS parallel to each of the first direction axis DR1 and the second direction axis DR2. In the disclosure, a front surface (or an upper surface) and a rear surface (or a lower surface) of each component are defined on the basis of a direction in which the image IM is displayed. The front surface and the rear surface oppose each other in the third direction axis DR3, and the normal direction of each of the front surface and the rear surface may be parallel to the third direction axis DR3.

The display device ED in an embodiment may include the first display surface FS and a second display surface RS. The second display surface RS may be defined as a surface opposing at least a portion of the first display surface FS.

That is, the second display surface RS may be defined as a portion of a rear surface of the display device ED.

The display device ED in an embodiment may sense an external input applied from the outside. The external input may include various forms of inputs provided from the outside of the display device ED. In an embodiment, the external input may include not only a contact by a part of a user's body, such as a hand, but also an external input applied in close proximity to the display device ED, or adjacent thereto at a predetermined distance (e.g., hovering). Also, the external input may have various forms such as force, pressure, temperature, light, or the like.

In FIG. 1A and the following drawings, the first direction axis DR1 to the third direction axis DR3 are illustrated. Directions indicated by the first to third direction axes DR1, DR2, and DR3 described in the disclosure are relative concepts, and may be converted to different directions. In addition, the directions indicated by the first to third direction axes DR1, DR2, and DR3 may be described as first to third directions, and may be denoted by the same reference numerals.

The first display surface FS of the display device ED may include a first active region F-AA, and a first peripheral region F-NAA. The first active region F-AA may include an electronic module region EMA. The first active region F-AA may be a region activated according to an electrical signal. The display device ED in an embodiment may display the image IM through the first active region F-AA. In addition, various forms of external inputs may be sensed in the first active region F-AA. The first peripheral region F-NAA is adjacent to the first active region F-AA. The first peripheral region F-NAA may have a predetermined color. The first peripheral region F-NAA may surround the first active region F-AA. Accordingly, the shape of the first active region F-AA may be substantially defined by the first peripheral region F-NAA. However, this is only one of embodiments. The first peripheral region F-NAA may be disposed adjacent to only one side of the first active region F-AA, or may be omitted. The display device ED in an embodiment of the inventive concept may include an active region in various shapes, and is not limited to any particular embodiment.

The display device ED may include a folding region FA1 and non-folding regions NFA1 and NFA2. The display device ED may include a plurality of non-folding regions NFA1 and NFA2. The display device ED of an embodiment may include a first non-folding region NFA1 and a second non-folding region NFA2 disposed with the folding region FA1 interposed therebetween. FIG. 1A to FIG. 1C illustrate an embodiment of the display device ED including one folding region FA1, but the invention is not limited thereto, and the display device ED may have a plurality of folding regions.

Referring to FIG. 1B, the display device ED in an embodiment may be folded with respect to a first folding axis FX1. The first folding axis FX1 is a virtual axis extended in the first direction axis DR1, and the first folding axis FX1 may be parallel to a direction of a long side of the display device ED. The first folding axis FX1 may be extended along the first direction axis DR1 on the first display surface FS.

In an embodiment, the non-folding regions NFA1 and NFA2 may be disposed adjacent to the folding region FA1 with the folding region FA1 interposed therebetween. In an embodiment, the first non-folding region NFA1 may be disposed on one side of the folding region FA1 along the second direction DR2, and the second non-folding region NFA2 may be disposed on the other side of the folding region FA1 along the second direction DR2, for example.

The display device ED may be folded with respect to the first folding axis FX1 and transformed into an in-folded state in which, in the first display surface FS, one region overlapping the first non-folding region NFA1 and the other region overlapping the second non-folding region NFA2 face each other.

In the in-folded state, the second display surface RS of the display device ED in an embodiment may be visually recognized by a user. The second display surface RS may further include an electronic module region in which an electronic module including various components is disposed, and is not limited to any particular embodiment.

Referring to FIG. 1C, the display device ED in an embodiment may be folded with respect to the first folding axis FX1 and transformed into an out-folded state in which, in the second display surface RS, one region overlapping the first non-folding region NFA1 and the other region overlapping the second non-folding region NFA2 face each other.

However, the inventive concept is not limited thereto, and the display device ED may be folded with respect to a plurality of folding axes such that a portion of each of the first display surface FS and the second display surface RS may be folded to face each other, and the number of folding axes and the number of non-folding regions in accordance therewith are not particularly limited.

The electronic module region EMA may have various electronic modules disposed therein. In an embodiment, an electronic module may include at least one of a camera, a speaker, a light sensing sensor, or a heat sensing sensor, for example. The electronic module region EMA may sense an external object received through the first or second display surface FS or RS, or may provide a sound signal such as voice to the outside through the first or second display surface FS or RS. An electronic module may include a plurality of components, and is not limited to any particular embodiment.

The electronic module region EMA may be surrounded by the first active region F-AA and the first peripheral region F-NAA. However, the inventive concept is not limited thereto. The electronic module region EMA may be disposed inside the first active region F-AA, and is not limited to any particular embodiment.

Figure 2A:
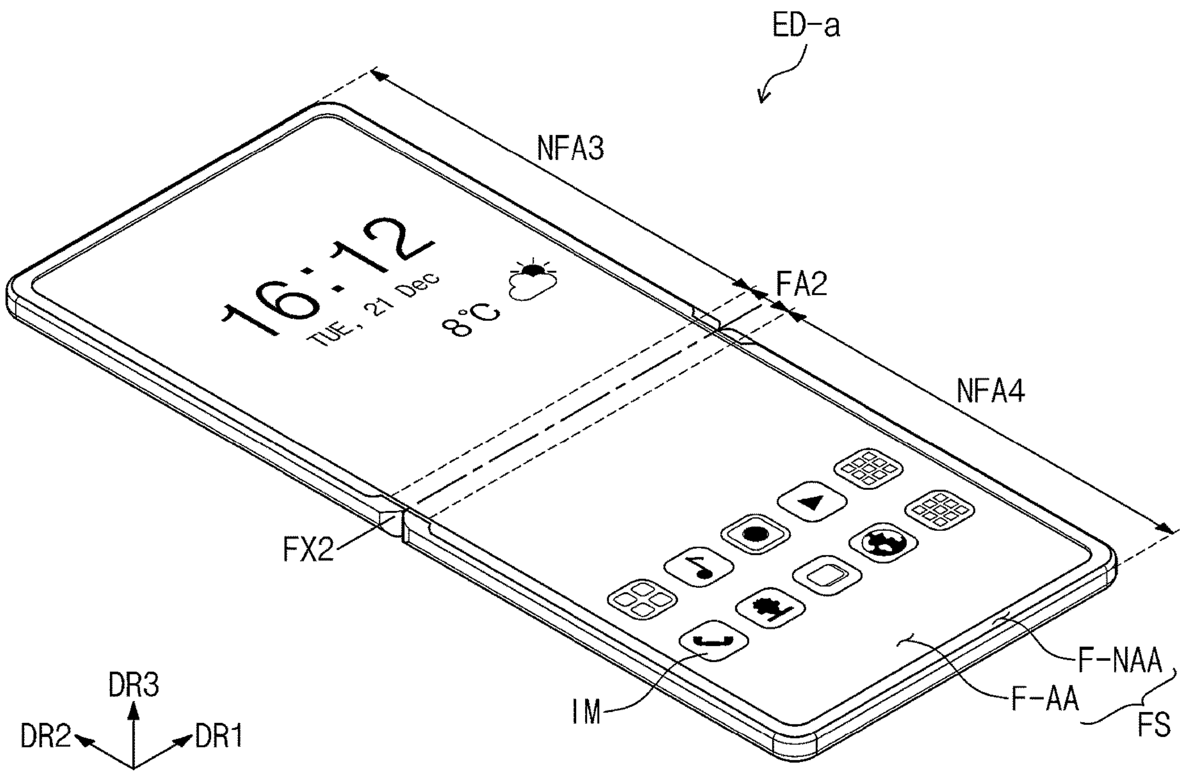
FIG. 2A is a perspective view showing an embodiment of a display device in an unfolded state according to the inventive concept.
Figure 2B:
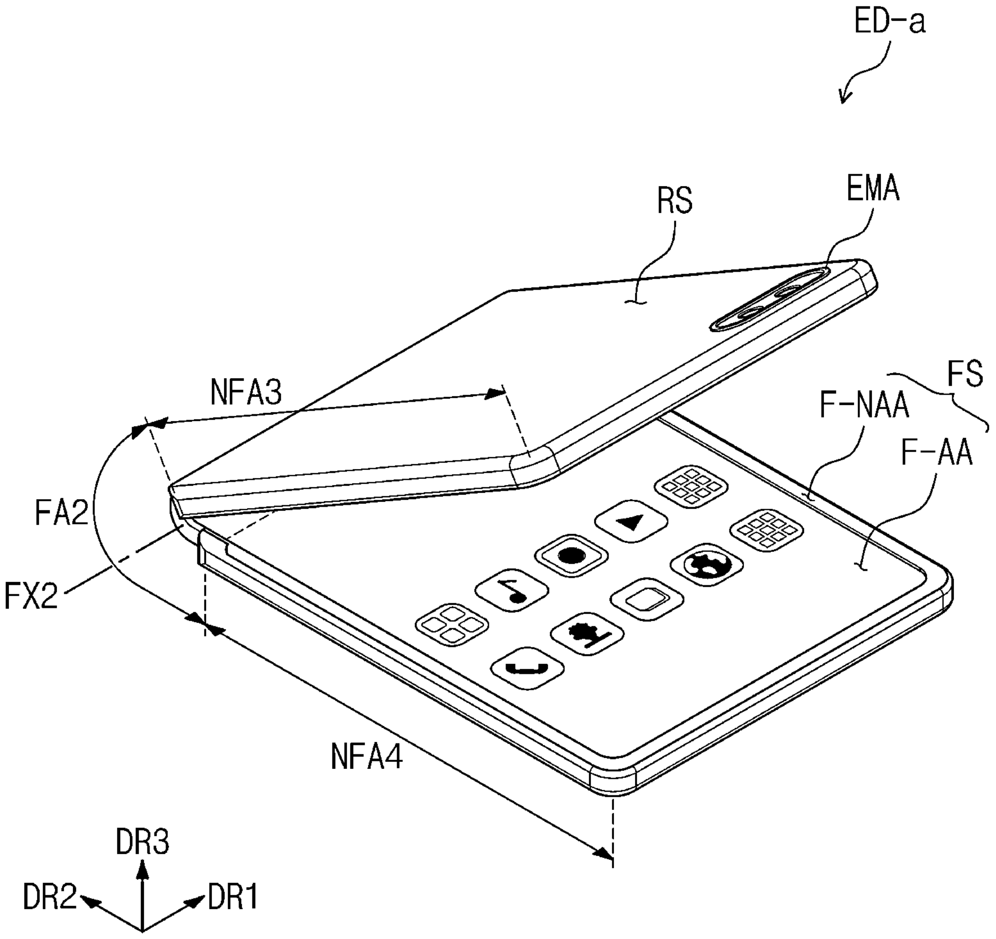
FIG. 2B is a perspective view showing an in-folding process of the display device illustrated in FIG. 2A.

FIG. 2A is a perspective view showing an embodiment of a display device in an unfolded state according to the inventive concept. FIG. 2B is a perspective view showing an in-folding process of the display device illustrated in FIG. 2A.

A display device Ed-a of an embodiment may be folded with respect to a second folding axis FX2 extended in one direction parallel to the first direction axis DR1. FIG. 2B illustrates a case in which an extension direction of the second folding axis FX2 is parallel to an extension direction of a short side of the display device ED-a. However, the inventive concept is not limited thereto.

The display device ED-a in an embodiment may include at least one folding region FA2 and a plurality of non-folding regions NFA3 and NFA4 adjacent to the folding region FA2. The non-folding regions NFA3 and NFA4 may be disposed spaced apart from each other with the folding region FA2 interposed therebetween.

The folding region FA2 has a predetermined curvature and a predetermined radius of curvature. In an embodiment, a first non-folding region NFA3 and a second non-folding region NFA4 face each other, and the display device ED-a may be in-folded such that the display surface FS is not exposed to the outside.

In addition, unlike what is illustrated, the display device ED-a may be out-folded such that the display surface FS is exposed to the outside. In an embodiment, when the display device ED-a is not folded, the first display surface FS may be visually recognized by a user, and when in the in-folded state, the second display surface RS may be visually recognized by a user. The second display surface RS may include an electronic module region EMA in which an electronic module including various components is disposed.

The display device ED-a in an embodiment may include the second display surface RS, wherein the second display surface RS may be defined as a surface opposing at least a portion of the first display surface FS. In the in-folded state, the second display surface RS may be visually recognized by a user. The second display surface RS may include an electronic module region EMA in which an electronic module including various components is disposed. In an embodiment, an image may be provided through the second display surface RS.

In an embodiment, the display devices ED and ED-a may be configured such that an in-folding or out-folding operation may be alternatively repeated from an un-folding operation, but the inventive concept is not limited thereto. In an embodiment, the display devices ED and ED-a may select one of the un-folding operation, the in-folding operation, and the out-folding operation.

Figure 3:
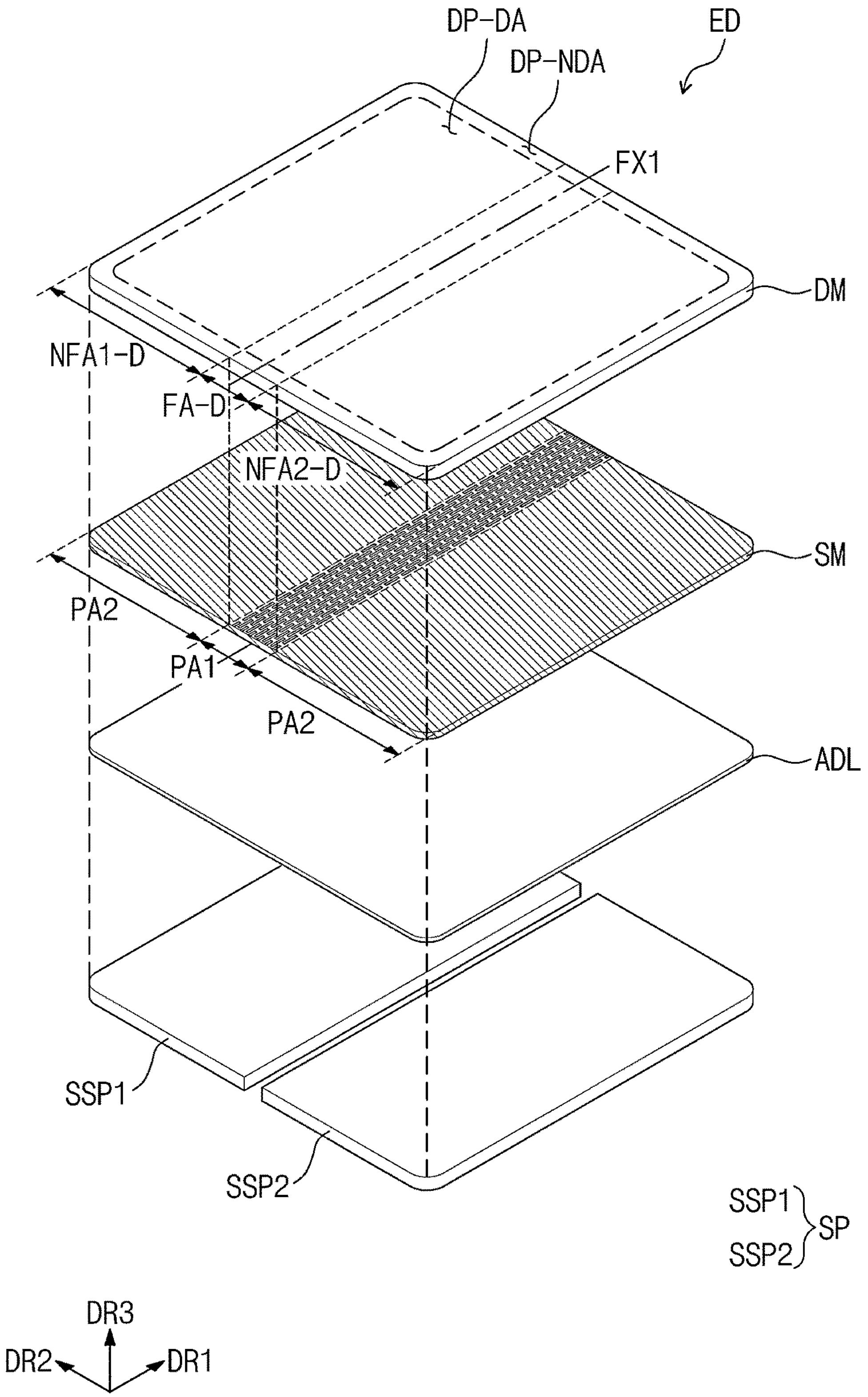
FIG. 3 is an exploded perspective view of an embodiment of a display device according to the inventive concept.
Figure 4:
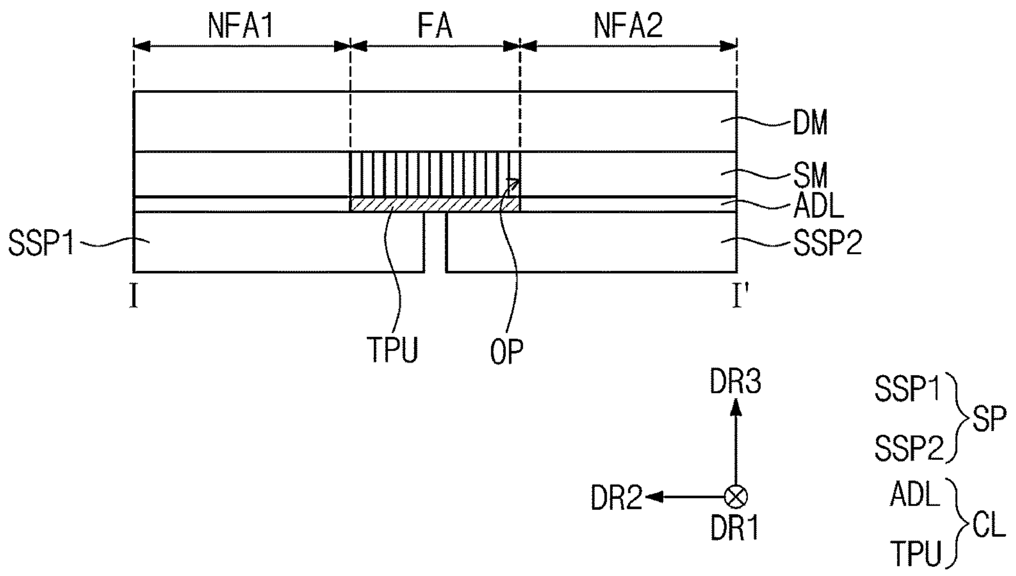
FIG. 4 is a cross-sectional view of an embodiment of a display device according to the inventive concept.

FIG. 3 is an exploded perspective view of an embodiment of a display device according to the inventive concept. FIG. 4 is a cross-sectional view of an embodiment of a display device according to the inventive concept. FIG. 3 illustrates an exploded perspective view of an embodiment of the display device illustrated in FIG. 1A. FIG. 4 is a cross-sectional view showing a portion corresponding to line I-I' of FIG. 1A.

Referring FIG. 3 and FIG. 4, the display device ED of an embodiment may include a display module DM, a support member SM disposed on a lower side of the display module DM. The display device ED of an embodiment may further include a base substrate SP disposed on a lower side of the support member SM. In addition, the display device ED of an embodiment may further include a cushion layer CL between the support member SM and the base substrate SP.

In the display device ED an embodiment, the display module DM may display an image according to an electrical signal, and may transmit/receive information on an external input. A non-display region DP-NDA is adjacent to a display region DP-DA. In an embodiment, the non-display region DP-NDA may surround the display region DP-DA, for example. However, this is only one of embodiments. The non-display region DP-NDA may be defined in various shapes, and is not limited to any particular embodiment. In an embodiment, the display region DP-DA of the display module DM may correspond to at least a portion of the first active region F-AA (refer to FIG. 1A).

Although not illustrated, the display module DM may include a display panel (not shown), and an input sensor (not shown) disposed on the display panel (not shown). The display panel (now shown) may include a display element layer. In an embodiment, the display element layer may include an organic electroluminescence element, quantum dot luminescence element, or liquid crystal element layer, for example. However, the inventive concept is not limited thereto.

The display module DM may further include an optical layer (not shown) disposed on the input sensor (not shown). The optical layer (not shown) may perform a function of reducing reflection by an external light. In an embodiment, the optical layer (now shown) may include a polarizing layer or a color filter layer, for example.

In the display device ED in an embodiment, the display module DM may include a folding display portion FA-D and non-folding display portions NFA1-D and NFA2-D. The folding display portion FA-D may be a portion corresponding to the folding region FA1 (refer to FIG. 1A), and the non-folding display portions NFA1-D and NFA2-D may be portions corresponding to the non-folding regions NFA1 and NFA2 (refer to FIG. 1A).

The folding display portion FA-D may correspond to a portion folded or bent with respect to the first folding axis FX1. The display module DM includes a first non-folding display portion NFA1-D and a second non-folding display portion NFA2-D, wherein the first non-folding display portion NFA1-D and the second non-folding display portion NFA2-D may be spaced apart from each other with the folding display portion FA-D interposed therebetween.

The support member SM may be disposed on a lower side of the display module DM. The support member SM may support the display module DM.

In the display device ED in an embodiment, the support member SM may include a first portion PA1 and a second portion PA2. The first portion PA1 may be a portion corresponding to the folding region FA1 (refer to FIG. 1A), and the second portion PA2 may be a portion corresponding to the non-folding regions NFA1 and NFA2 (refer to FIG. 1A).

In an embodiment, a plurality of openings OP may be defined in the support member SM in the second portion PA2. The openings OP may each have the same width in the second direction DR2. However, this is only one of embodiments and the inventive concept is not limited thereto. In an embodiment, at least one of the widths of the openings OP in the second direction DR2 may be different from the other widths, for example.

In addition, the openings OP may each have the same width in the first direction DR1. However, this is only one of embodiments and the inventive concept is not limited thereto. In an embodiment, at least one of the widths of the openings OP in the first direction DR1 may be different from the other widths, for example.

The base substrate SP may be disposed on a lower side of the support member SM. The base substrate SP may perform a function of supporting the support member SM. The base substrate SP may include a first sub-base substrate SSP1 and a second sub-base substrate SSP2.

The first sub-base substrate SSP1 and the second sub-base substrate SSP2 may be disposed spaced apart from each apart in the second direction DR2. The first sub-base substrate SSP1 may overlap the folding region FA and the first non-folding region NFA1, and the second sub-base substrate SSP2 may overlap the folding region FA and the second non-folding region NFA2.

The cushion layer CL may include a cushion member TPU in a portion overlapping the folding region FA, and may include an adhesive layer ADL in a portion overlapping the non-folding regions NFA1 and NFA2. The cushion member TPU may include an elastomer such as sponge, foam, or a urethane resin. In addition, the cushion member TPU may be formed by including at least one of an acrylic polymer, a urethane-based polymer, a silicone-based polymer, or an imide-based polymer. However, the inventive concept is not limited thereto. The adhesive layer ADL may include an optically clear resin ("OCR"), or an optically clear adhesive ("OCA").

Hereinafter, referring to FIG. 5 to FIG. 12, a method for manufacturing a display device of an embodiment will be described in detail. The same contents as those described for structural features of the display device described with reference to FIG. 1A to FIG. 4 will not be repeated, and features of the method for manufacturing the display device will be mainly described.

Figure 5:
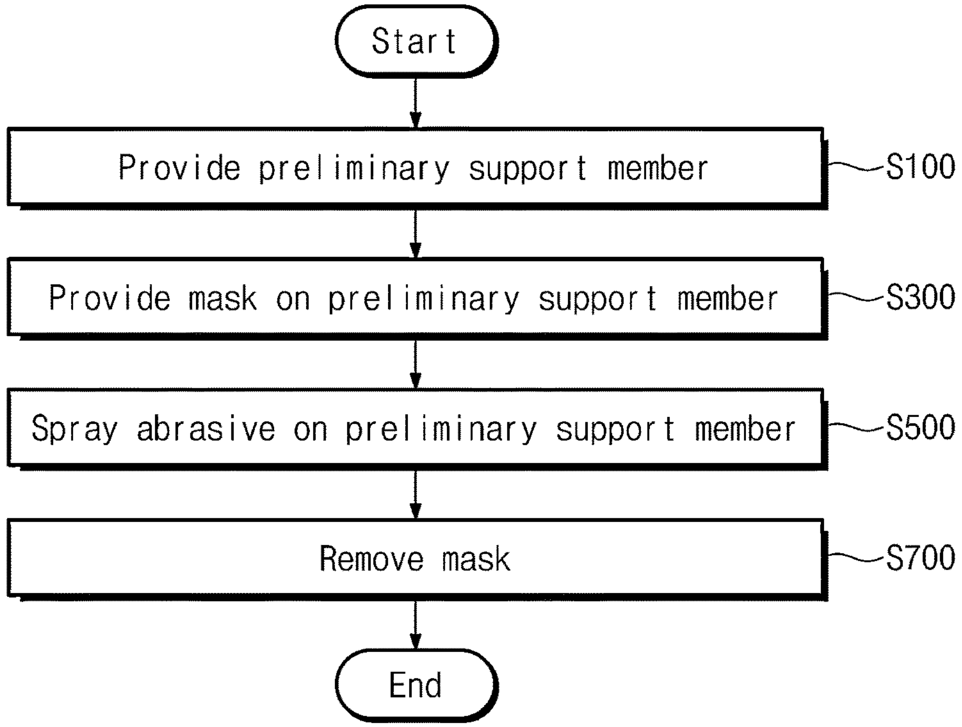
FIG. 5 is a flowchart of an embodiment of a method for manufacturing a display device according to the inventive concept.
Figure 6:
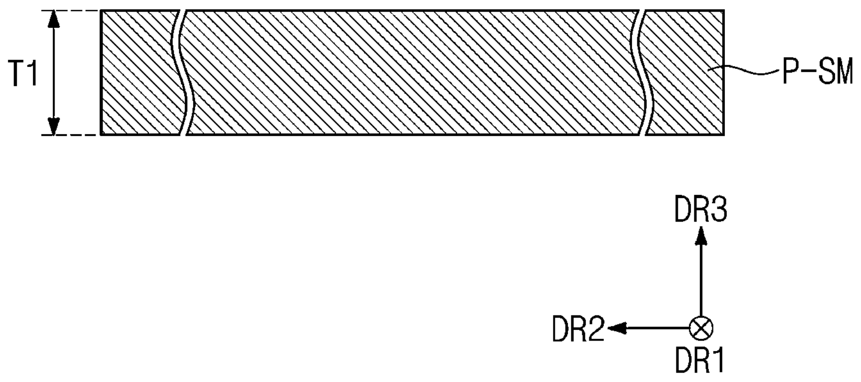
FIG. 6 is a view showing an embodiment of one operation of a method for manufacturing a display device according to the inventive concept.
Figure 8:
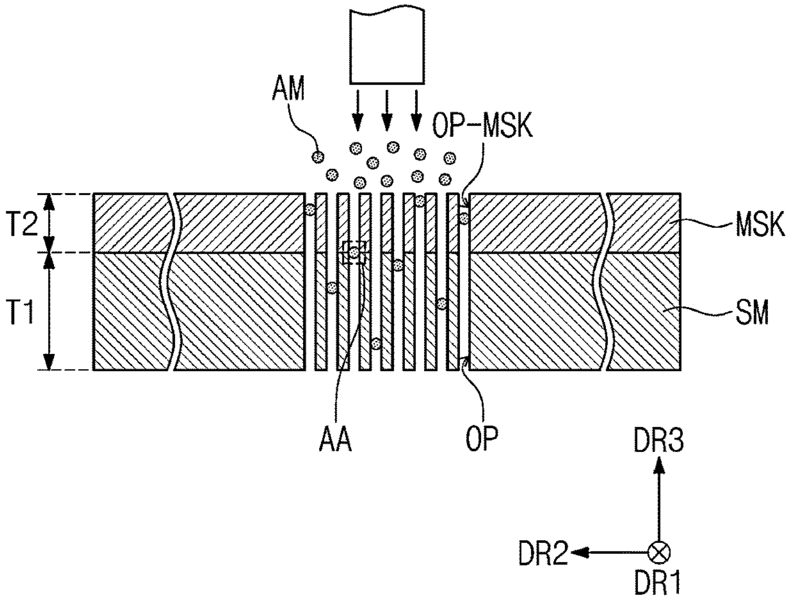
FIG. 8 is a view showing an embodiment of one operation of an embodiment of a method for manufacturing a display device according to the inventive concept.
Figure 9:
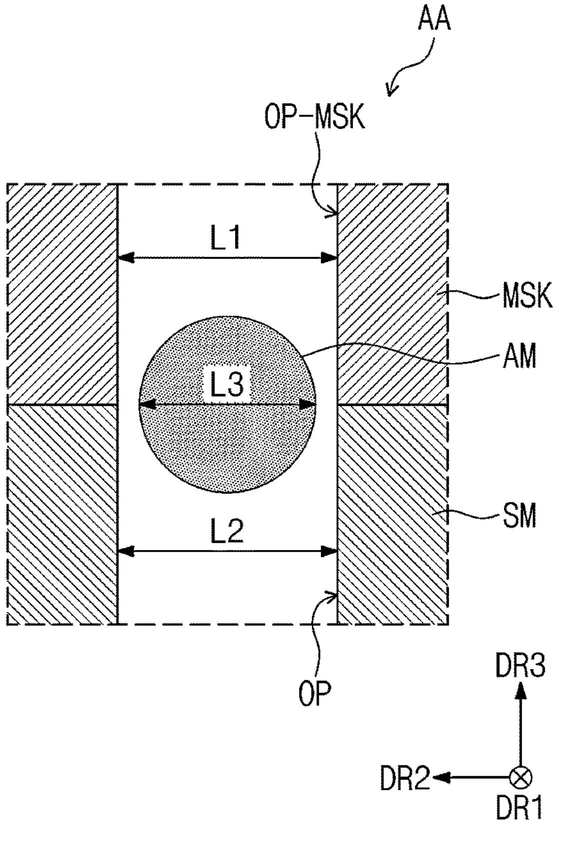
FIG. 9 is an enlarged view showing an embodiment of one operation of a method for manufacturing a display device according to the inventive concept.
Figure 10:
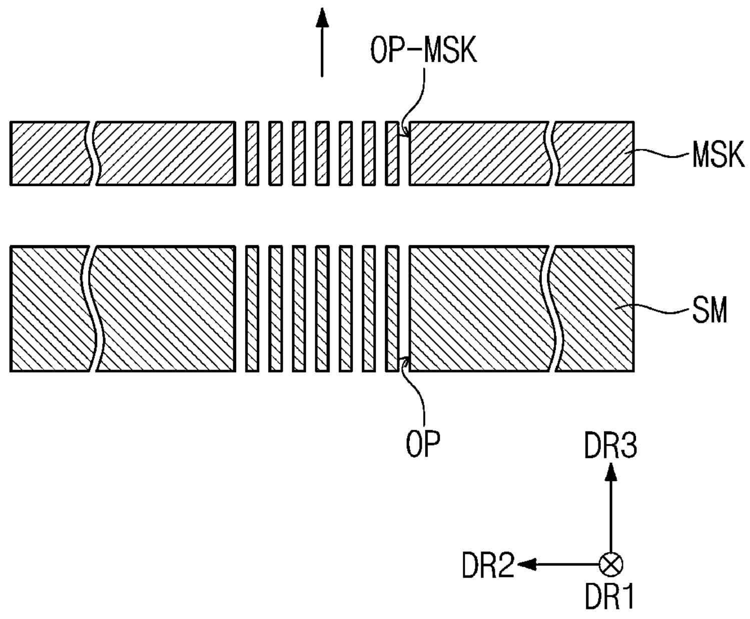
FIG. 10 is a view showing an embodiment of one operation of a method for manufacturing a display device according to the inventive concept.

FIG. 5 is a flowchart of an embodiment of a method for manufacturing a display device according to the inventive concept. FIG. 6, FIG. 8, and FIG. 10 are each a view showing an embodiment of one operation of a method for manufacturing a display device according to the inventive concept. FIG. 9 is an enlarged view showing an embodiment of one operation of a method for manufacturing a display device according to the inventive concept.

The method for manufacturing a display device of an embodiment may include providing a preliminary support member (S100), providing a mask on the preliminary support member (S300), spraying an abrasive on the preliminary support member (S500), and removing the mask (S700).

FIG. 6 showing the providing of a preliminary support member (S100). Referring to FIG. 6, the providing of a preliminary support member (S100) may include providing a preliminary support member P-SM in which the opening OP is not defined (refer to FIG. 8). The preliminary support member P-SM may correspond to a member to be processed in the state before being processed to be the support member SM (refer to FIG. 8). The preliminary support member P-SM may include fiber reinforced plastic. Specifically, the preliminary support member P-SM may include carbon fiber reinforced plastic or glass fiber reinforced plastic.

A thickness T1 of the preliminary support member P-SM may be about 120 micrometers (μm) to about 200 μm. When the thickness T1 of the preliminary support member P-SM is less than about 120 μm, there is a limitation to stably disposing a mask MSK (refer to FIG. 6) on the preliminary support member P-SM in the following operation (refer to S300 in FIG. 5) of providing a mask on the preliminary support member (refer to S300 in FIG. 5). When the thickness T1 of the preliminary support member P-SM is more than about 200 μm, the thickness of a manufactured display device ED (refer to FIG. 1A) including the support member SM (refer to FIG. 4) increases, and accordingly, there is a problem in that folding properties of the display device ED (refer to FIG. 1A) are degraded.

Figure 7:
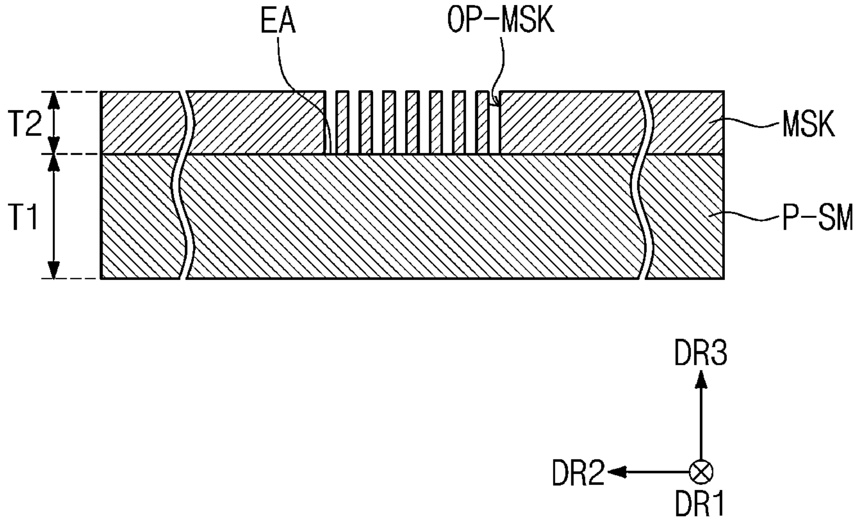
FIG. 7 is a view showing an embodiment of one operation of an embodiment of a method for manufacturing a display device according to the inventive concept.

FIG. 7 shows the providing of a mask on the preliminary support member (S300). Referring to FIG. 7, the providing of a mask on the preliminary support member (S300) may include providing the mask MSK on one surface of the preliminary support member P-SM. The mask MSK may be bonded on the preliminary support member P-SM using a magnet, or the mask MSK may be laminated with the preliminary support member P-SM. However, this is only one of embodiments, and the inventive concept is not limited thereto. Any method may be used without limitation as long as it is a method capable of fixing the mask MSK on the preliminary support member P-SM.

On one surface of the mask MSK, a plurality of mask openings OP-MSK may be defined. The mask openings OP-MSK may all have the same width in the second direction DR2. However, this is only one of embodiments the inventive concept is not limited thereto. In an embodiment, at least one of the widths of the mask openings OP-MSK in the second direction DR2 may be different from the other widths, for example. Although not illustrated, the mask openings OP-MSK may all have the same shape in a plan view, or at least one shape thereof may be different from the other shapes.

In an embodiment, the mask MSK may be provided with the mask openings OP-MSK defined thereon. However, this is only one of embodiments and the inventive concept is not limited thereto. In an embodiment, the mask openings OP-MSK may be provided by disposing a preliminary mask P-MSK on the preliminary support member P-SM, followed by providing the mask openings OP-MSK on the preliminary mask P-MSK, for example.

The preliminary support member P-SM may include a surface EA exposed by the mask openings OP-MSK. The exposed surface EA of the preliminary support member P-SM may be a portion to be processed by an abrasive AM (refer to FIG. 8) in the following operation S500 (refer to FIG. 5) of spraying an abrasive. Accordingly, the shapes of the mask openings OP-MSK may correspond to the shapes of the openings OP defined on the support member SM (refer to FIG. 4).

In an embodiment, the mask may include a steel use stainless ("SUS") alloy, an Invar alloy, aluminum (Al), copper (Cu), or thermoplastic polyurethane ("TPU"). The strength of the mask MSK may be greater than the strength of the preliminary support member P-SM. In the disclosure, the strength is described based on the Mohs hardness.

A thickness T2 of the mask MSK may be less than the thickness of the preliminary support member P-SM. The thickness T2 of the mask MSK may be about 30 μm to about 100 μm. When the thickness T2 of the mask MSK is less than about 30 μm, grooves generated in the mask MSK by the abrasive AM (refer to FIG. 8) in the following operation S500 (refer to FIG. 5) of spraying an abrasive are transferred onto the surface of the preliminary support member P-SM disposed in a lower portion of the mask MSK, so that there is a problem in that the grooves are on the surface of the preliminary support member P-SM. When the thickness T2 of the mask MSK is greater than about 100 μm, the abrasive SM (refer to FIG. 8) passes through the mask openings OP-MSK in the following operation S500 (refer to FIG. 5) of spraying an abrasive, so that an average number of the abrasives arriving at the preliminary support member P-SM may decrease. Accordingly, it takes longer time to define the openings OP (refer to FIG. 4) on the preliminary support member P-SM, so that there is a problem in that the total process time increases.

FIG. 8 shows the spraying of an abrasive on the preliminary support member (S500). FIG. 9 is an enlarged view of the spraying of an abrasive on the preliminary support member (S500). FIG. 9 is an enlarged view of AA portion illustrated in FIG. 8.

Referring to FIG. 8 and FIG. 9, the spraying of an abrasive on the preliminary support member (S500) may include forming the support member SM processed by the abrasive AM. The openings OP may be defined in the support member SM in a portion overlapping the mask openings OP-MSK.

The abrasive AM may not process the mask MSK, but selectively process only the support member SM. The strength of the abrasive AM may be less than the strength of the mask MSK, and may be greater than the strength of the support member SM. The abrasive AM may have a Mohs hardness of about 5 to about 7. In an embodiment, the abrasive AM may include an aluminum oxide, for example. However, this is only one of embodiments, and the inventive concept is not limited thereto. In an embodiment, any material may be used as the abrasive AM without limitation as long as it is a material capable of selectively processing only the support member SM without processing the mask MSK, for example.

Since the abrasive AM does not process the mask MSK, and selectively processes only the support member SM, the mask MSK is not deformed, so that it is possible to reuse the mask MSK. By reusing the mask MSK, it is possible to reduce process costs of the method for manufacturing a display device.

An average diameter L3 of the abrasives AM may be less than a width L1 of the mask opening OP-MSK in the second direction DR2. The average diameter L3 of the abrasives AM may be less than a width L2 of the opening OP in the second direction DR2. Since the average diameter L3 of the abrasives AM is less than the width L1 of the mask opening OP-MSK in the second direction DR2, the abrasive AM may pass through the mask opening OP-MSK, and may define an opening OH on the support member SM. The average diameter L3 of the abrasives AM may be about 30 μm to about 100 μm.

The width L1 of the mask opening OP-MSK in the second direction DR2 is illustrated as being the same as the width L2 of the opening OP in the second direction DR2, but the inventive concept is not limited thereto. In an embodiment, the width L1 of the mask opening OP-MSK in the second direction DR2 may be less than the width L2 of the opening OP in the second direction DR2, for example.

FIG. 10 is a view showing the removing of the mask (S700). Referring to FIG. 10, the removing of the mask (S700) may be removing the mask MSK on the support member SM. As a result, it is possible to provide the support member SM in which the opening OP is defined as illustrated in FIG. 4.

Figure 11A:
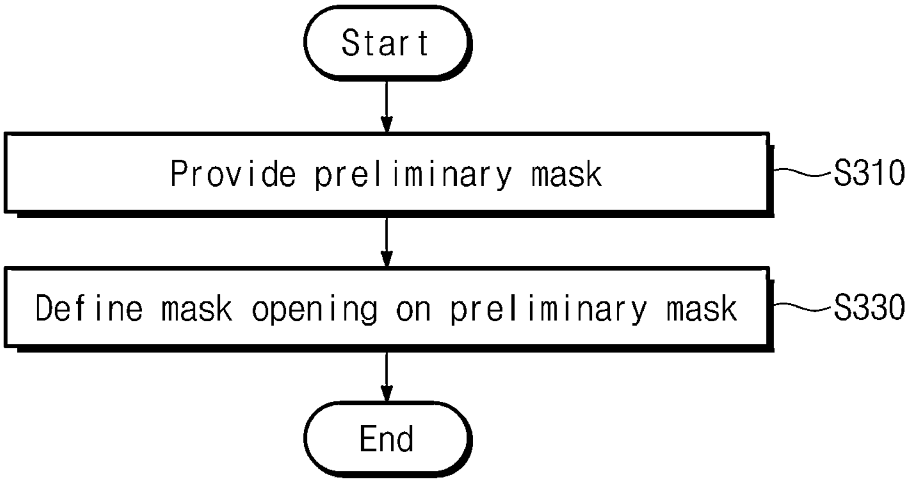
FIG. 11A is a flowchart showing an embodiment of an operation of providing a mask on a preliminary support member in detail in a method for manufacturing a display device according to the inventive concept.
Figure 11B:
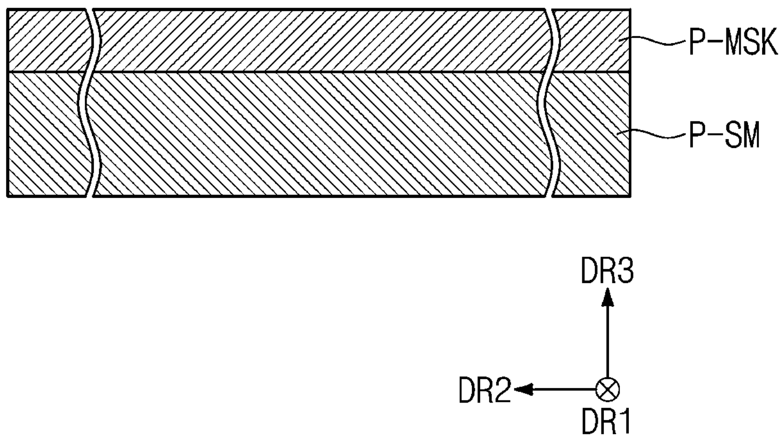
FIG. 11B is a view showing an embodiment of one operation of a method for manufacturing a display device according to the inventive concept.
Figure 11C:
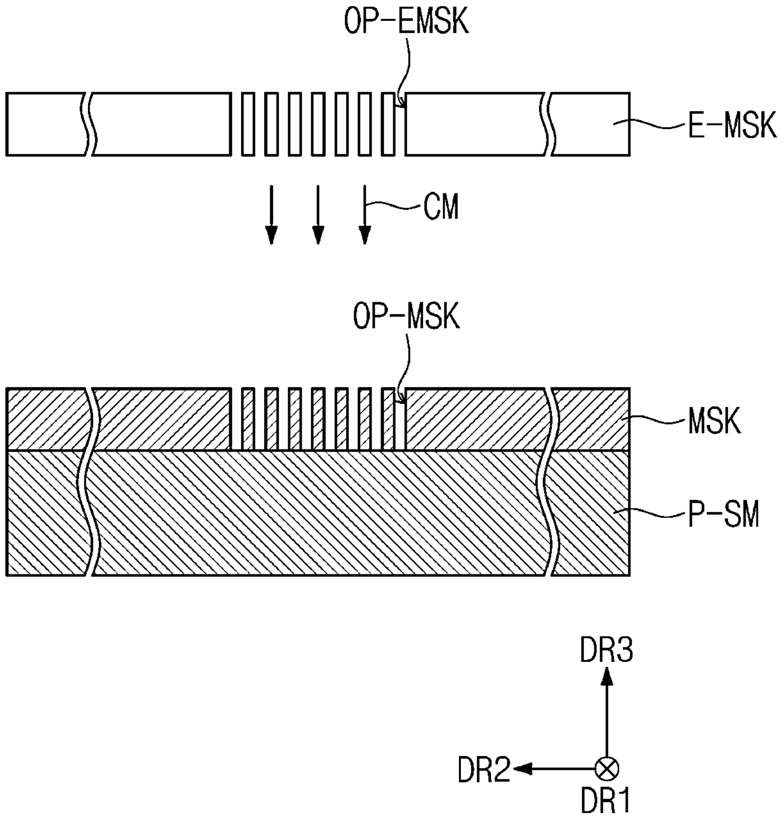
FIG. 11C is a view showing an embodiment of one operation of a method for manufacturing a display device according to the inventive concept.
Figure 12A:
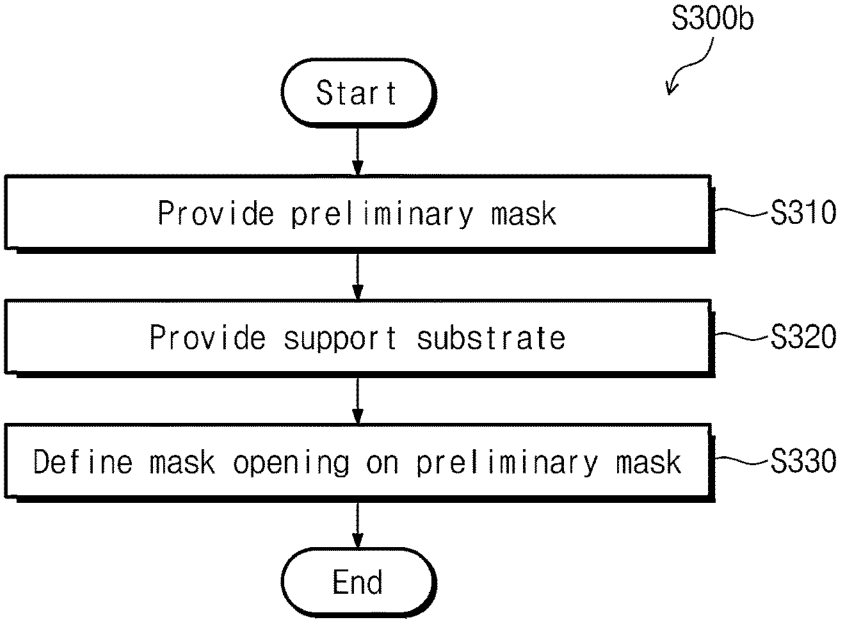
FIG. 12A is a flowchart showing an operation of providing a mask on a preliminary support member in detail.
Figure 12B:
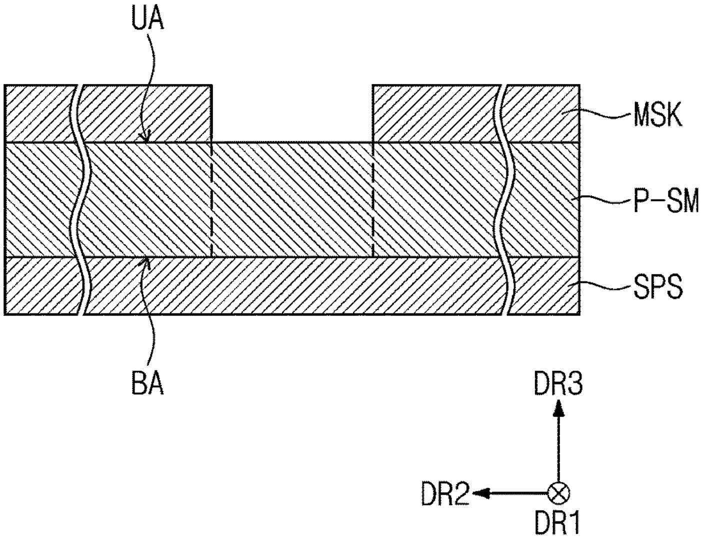
FIG. 12B is a view showing an embodiment of one operation of a method for manufacturing a display device according to the inventive concept.
Figure 13A:
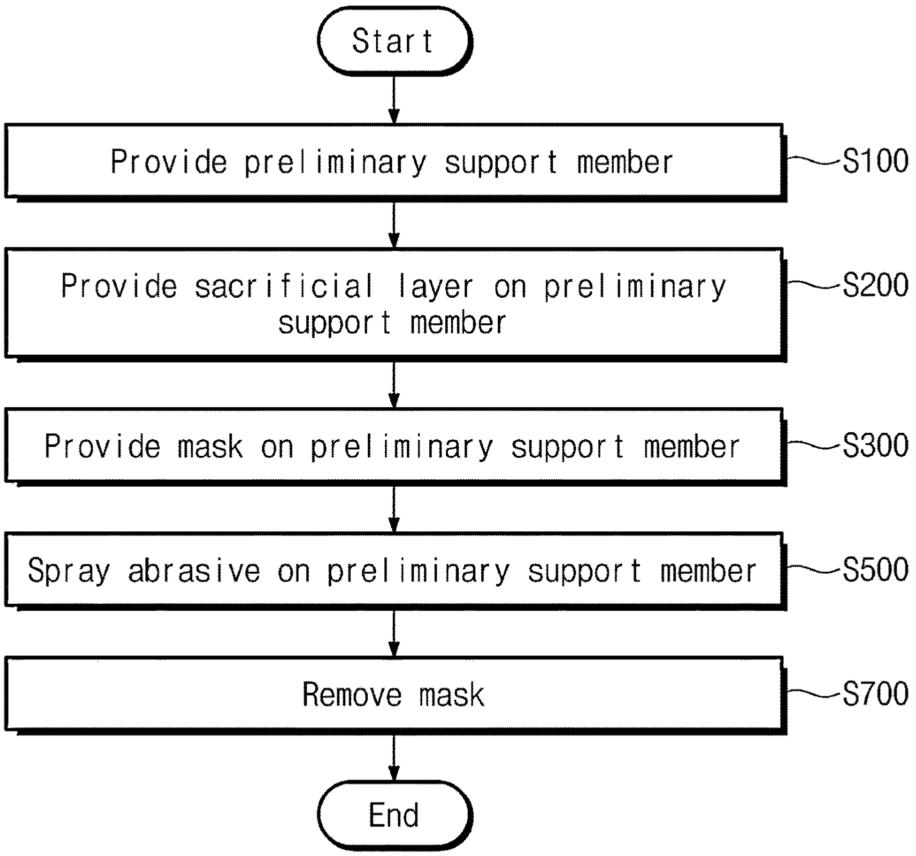
FIG. 13A is a flowchart showing an embodiment of a method for manufacturing a display device according to the inventive concept.
Figure 13B:
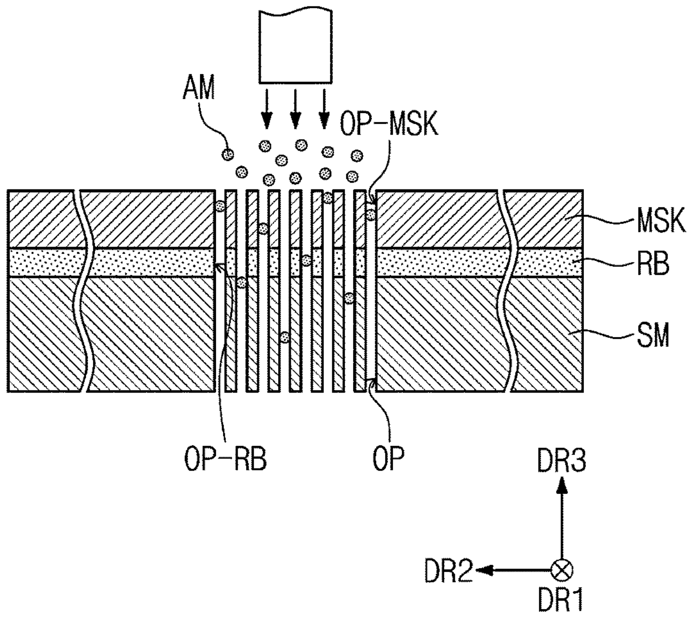
FIG. 13B is a view showing an embodiment of one operation of a method for manufacturing a display device according to the inventive concept.

FIG. 11A is a flowchart showing an embodiment of an operation of providing a mask on the preliminary support member in detail in a method for manufacturing a display device according to the inventive concept. FIG. 11B and FIG. 11C are views showing an embodiment of one operation of a method for manufacturing a display device according to the inventive concept. FIG. 12A is a flowchart showing an operation of providing a mask on the preliminary support member in detail. FIG. 12B is a view showing an embodiment of one operation of a method for manufacturing a display device according to the inventive concept. FIG. 13A is a flowchart showing an embodiment of a method for manufacturing a display device according to the inventive concept. FIG. 13B is a view showing an embodiment of one operation of a method for manufacturing a display device according to the inventive concept.

FIG. 13 is a view schematically showing an embodiment of one operation of a method for manufacturing a display device according to the inventive concept. Hereinafter, referring to FIG. 11A to FIG. 13B, a method for manufacturing a display device of an embodiment will be described in detail. The same contents as those described with reference to FIG. 5 to FIG. 10 will not be repeated, and differences will be mainly described.

Compared to the providing of a mask on the preliminary support member illustrated in FIG. 7, there is a difference in that the providing of a mask on the preliminary support member illustrated in FIG. 11A to FIG. 11C includes providing a preliminary mask with no mask openings defined on the preliminary support member, and defining mask openings on the preliminary mask.

Referring to FIG. 11A to FIG. 11C, providing a mask on the preliminary support member (S300-*a*) may include providing a preliminary mask on the preliminary support member S310, and defining mask openings on the preliminary mask (S330). The preliminary mask P-MSK may be a member to be processed, which is to be processed into the mask MSK (refer to FIG. 7) by defining the mask openings on OP-MSK (refer to FIG. 7). The preliminary mask P-MSK may include at least one of an SUS alloy, an Invar alloy, aluminum, copper, or thermoplastic polyurethane.

The operation S330 of defining the mask openings OP-MSK on the preliminary mask P-MSK disposed on the preliminary support member P-SM may include wet-etching the preliminary mask opening P-MSK by spraying a deposition solution CM. Specifically, the operation S330 of defining the mask openings OP-MSK on the preliminary mask P-MSK disposed on the preliminary support member P-SM may include disposing an etching mask E-MSK on the preliminary mask P-MSK.

On the etching mask E-MSK, an etching opening OP-EMSK may be defined. The widths of the etching openings OP-EMSK in the second direction DR2 may all be the same. However, this is only one of embodiments, and the inventive concept is not limited thereto. At least one of the widths of the etching openings OP-EMSK in the second direction DR2 may be different from the other widths. The mask opening OP-MSK may be defined in the mask MSK in a portion overlapping the etching opening OP-EMSK. That is, the positions, shapes, and numbers of the etching openings OP-EMSK may respectively correspond to the positions, shapes, and numbers of the mask openings OP-MSK.

As illustrated in FIG. 12A and FIG. 12B, an operation S300*b* of providing of the mask on the preliminary support member in an embodiment may further include, between the operation S310 of providing the preliminary mask P-MSK on the preliminary support member P-SM and the operation S330 of defining the mask openings OP-MSK on the preliminary mask P-MSK, an operation S320 of providing a support substrate SPS including the same material as that of the preliminary mask P-MSK on a lower surface BA facing an upper surface UA of the preliminary support member P-SM. In the operation S500 (refer to FIG. 5) of spraying an abrasive, the support substrate SPS may perform a function of preventing the preliminary support member P-SM from being bent.

FIG. 13A is a flowchart showing an embodiment of a method for manufacturing a display device according to the inventive concept. FIG. 13B is a view showing an embodiment of one operation of a method for manufacturing a display device according to the inventive concept.

Referring to FIG. 13A and FIG. 13B, a method for manufacturing a display device of an embodiment may further include, between the operation S100 of providing of a preliminary support member and the operation S300 of providing a mask on the preliminary support member, an operation S200 of providing a sacrificial layer on the preliminary support member. The mask MSK may be is disposed on a sacrificial layer RB. The strength of the sacrificial layer RB may be less than the strength of the abrasive AM. The sacrificial layer RB may include a silicone-based resin, or a polyurethane-based resin. The sacrificial layer RB may adhere the support member SM and the mask MSK. As a result, adhesion between the support member SM and the mask MSK may be increased, so that process accuracy may be increased.

In an embodiment, the operation S500 of spraying an abrasive on the preliminary support member may include defining sacrificial openings OP-RB on the sacrificial layer RB which is exposed by the mask openings OP-MSK, and defining the openings OP on the preliminary support member P-SM (refer to FIG. 7) which is exposed by the mask openings OP-MSK and the sacrificial openings OP-RB. Each of the mask openings OP-MSK and each of the sacrificial openings OP-RB may overlap each other. Each of the sacrificial openings OP-RB and each of the openings OP may overlap each other. Each of the mask openings OP-MSK, each of the sacrificial openings OP-RB, and each of the openings OP may overlap each other.

A method for manufacturing a display device of an embodiment may directly dispose a mask on a preliminary support member to directly define an opening on the preliminary support member. That is, the method includes a one-operation process of directly patterning a support member using a mask, without a two-operation of forming a patterning layer on a preliminary support member, and then patterning the preliminary support member exposed by the patterning layer. Accordingly, a process of patterning the support member is simplified, and a patterning layer is not additionally used, so that it is possible to reduce process costs.

A method for manufacturing a display device in an embodiment includes an operation in which a mask is directly disposed on a preliminary support member, and then an abrasive is sprayed on the mask, so that there are effects of simplifying a process, and reducing process costs.

Although the inventive concept has been described with reference to a preferred embodiment of the inventive concept, it will be understood by those skilled in the art that various changes in form and details may be made therein without departing from the spirit and scope of the inventive concept as set forth in the following of the claims.

Accordingly, the technical scope of the inventive concept is not intended to be limited to the contents set forth in the detailed description of the specification, but is intended to be defined by the appended claims.

What is claimed is:

1. A method for manufacturing a display device which is divided into a folding region and a non-folding region, and includes a support member in which a plurality of openings is defined corresponding to the folding region, and a display module disposed in an upper portion of the support member, the method comprising:

providing a preliminary support member including carbon fiber reinforced plastic or glass fiber reinforced plastic;

providing a mask in which a plurality of mask openings is defined on the preliminary support member;

spraying an abrasive on the preliminary support member exposed by the plurality of mask openings; and removing the mask, wherein the providing the mask on the preliminary support member comprises:

providing a preliminary mask on the preliminary support member;

providing a support substrate including a same material as that of the preliminary mask on a lower surface facing an upper surface of the preliminary support member; and defining the plurality of mask openings in the preliminary mask without defining an opening in the support substrate so that the support substrate performs a function of preventing a portion of the preliminary support member exposed by the preliminary mask from being bent during the spraying the abrasive.

2. The method of claim 1, wherein a Mohs hardness of the abrasive is less than a Mohs hardness of the mask, and greater than a Mohs hardness of the preliminary support member.

3. The method of claim 1, wherein the abrasive comprises an aluminum oxide.

4. The method of claim 1, wherein the defining the plurality of mask openings on the preliminary mask comprises wet-etching the preliminary mask.

5. The method of claim 1, wherein the providing the mask on the preliminary support member comprises defining the plurality of mask openings on the preliminary mask and then providing the mask on the preliminary support member.

6. The method of claim 5, wherein in the providing the mask on the preliminary support member, the mask is directly disposed on the preliminary support member.

7. The method of claim 1, wherein the mask comprises at least one of a stainless steel alloy, an Invar alloy, aluminum, copper, or thermoplastic polyurethane.

8. The method of claim 1, wherein the abrasive has an average diameter of about 30 micrometers to about 100 micrometers.

9. The method of claim 1, wherein the mask has a thickness of about 30 micrometers to about 100 micrometers.

10. The method of claim 1, wherein the preliminary support member has a thickness of about 120 micrometers to about 200 micrometers.

11. The method of claim 1, wherein a width of each of the plurality of mask openings in a first direction is greater than a diameter of the abrasive.

* * * * *